United States Patent
Cellier et al.

(10) Patent No.: US 8,937,507 B2
(45) Date of Patent: Jan. 20, 2015

(54) SELF OSCILLATING MODULATOR

(75) Inventors: Rémy Cellier, Lyons (FR); Gaël Pillonnet, Brignais (FR)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/695,531

(22) PCT Filed: May 19, 2011

(86) PCT No.: PCT/EP2011/058218
§ 371 (c)(1),
(2), (4) Date: Oct. 31, 2012

(87) PCT Pub. No.: WO2011/147744
PCT Pub. Date: Dec. 1, 2011

(65) Prior Publication Data
US 2013/0049856 A1    Feb. 28, 2013

Related U.S. Application Data

(60) Provisional application No. 61/387,663, filed on Sep. 29, 2010.

(30) Foreign Application Priority Data

May 25, 2010    (EP) .................................... 10305550

(51) Int. Cl.
*H03F 3/38*    (2006.01)
*H03F 3/217*   (2006.01)
*H03F 3/68*    (2006.01)

(52) U.S. Cl.
CPC .............. *H03F 3/2178* (2013.01); *H03F 3/217* (2013.01); *H03F 3/68* (2013.01)
USPC ............................................ 330/10; 330/251

(58) Field of Classification Search
CPC ... H03F 3/217; H03F 3/2173; H03F 2200/03; H03F 2200/351; H03F 2200/78; H03F 2203/45138; H03F 3/187; H03F 1/34; H03F 3/68; H03F 1/0294; H03F 1/26; H03F 1/3205; H03F 2200/264; H03F 2200/345
USPC ....................................... 330/10, 207 A, 251
See application file for complete search history.

(56) References Cited

U.S. PATENT DOCUMENTS

| | | | |
|---|---|---|---|
| 7,167,046 B2 * | 1/2007 | Maejima | 330/207 A |
| 7,262,658 B2 * | 8/2007 | Ramaswamy et al. | 330/251 |
| 7,786,796 B2 * | 8/2010 | Liu | 330/10 |
| 8,022,756 B2 * | 9/2011 | Walker et al. | 330/10 |
| 8,040,184 B2 * | 10/2011 | Tsuchiya | 330/10 |
| 8,421,535 B2 * | 4/2013 | Hlibowicki | 330/251 |
| 2005/0068121 A1 | 3/2005 | Nielsen et al. | |

OTHER PUBLICATIONS

Extended European Search Report issued in corresponding European application No. EP 10 30 5550, completion date Aug. 25, 2010.

(Continued)

*Primary Examiner* — Khanh V Nguyen
(74) *Attorney, Agent, or Firm* — Patent Portfolio Builders PLLC

(57) ABSTRACT

There is described a self oscillating modulator circuit comprising at least two coupled self oscillating loop modules, that achieved a good efficiency and a good linearity.

14 Claims, 4 Drawing Sheets

(56) References Cited

OTHER PUBLICATIONS

International Search Report issued in corresponding International application No. PCT/EP2011/058218, mailing date Jul. 1, 2011.

Kim, Hyoung-Sik et al., "Low Cost Implementation of Filterless Class D Audio Amplifier with Constant Switching Frequency", IEEE Transactions on Consumer Electronics, IEEE Service Center, New York, NY, US, DOI: 10.1109/TCE.2006.1605027, vol. 52, No. 4, Nov. 1, 2006, pp. 1442-1446, XP011153030, ISSN: 0098-3063.

* cited by examiner

SELF OSCILLATING MODULATOR

BACKGROUND OF THE INVENTION

1. Technical Field

The present invention relates to audio amplifiers which find application, for instance, in user devices such as MP3 mobile phones, MP3 players, smart phones, etc. More specifically, the invention relates to class D amplifiers.

2. Related Art

Class D amplifiers are used in applications necessitating low-voltage requirements and/or a good power efficiency.

These amplifiers are generally controlled by using a pulse width modulation (PWM).

Some drawbacks associated to the use of PWM controlled class D amplifiers are as follows:

- the frequency bandwidth is lower than the frequency of the PWM because of stability, and
- in order to limit the distortion introduced by the PWM, the generation of the associated sawtooth signal must be highly accurate, which increases the costs associated with the class D amplifiers, and the silicon surface required for integration of the amplifier.

SUMMARY OF THE INVENTION

Therefore, a first aspect of the invention relates to a self oscillating modulator circuit.

According to the first aspect, there is provided a self oscillating modulator circuit comprising:

- at least two class D self oscillating loop modules, each module comprising an hysteresis comparator, and each module being configured for receiving a respective input signal and outputting a respective two-level signal,
- coupling means connecting said at least two loop modules, ahead of the hysteresis comparator of each module, for synchronizing said at least two self oscillating loop modules, and
- summing means for summing the respective output signals of each of said at least two self oscillating loop modules and for outputting a multi level modulated output signal.

Embodiments of the invention are recited in the dependent claims attached hereto.

Self oscillating loops provide an alternative to the PWM control.

The use of an hysteresis comparator introduces the delay which is necessary to obtain the self oscillating behaviour.

The use of a plurality of class D self oscillating loop modules enable to output a multi level output signal (for example a ternary signal) which has a large amplitude, an increased power, lower jitter sensitivity and better efficiency.

The coupling means enable a good frequency synchronization between the plurality of class D self oscillating loop modules, thereby maintaining the large amplitude of the output signal.

A second aspect of the present invention relates to an audio amplifier comprising a circuit according the first aspect.

A third aspect of the present invention relates to an audio device comprising an audio amplifier according to the second aspect.

A fourth aspect of the invention relates to a method of generating a multi level modulated output signal in a self oscillating modulator circuit.

BRIEF DESCRIPTION OF THE DRAWINGS

The present invention is illustrated by way of example, and not by way of limitation, in the figures of the accompanying drawings, in which like reference numerals refer to similar elements and in which.

DESCRIPTION OF PREFERRED EMBODIMENTS

Figure 1:
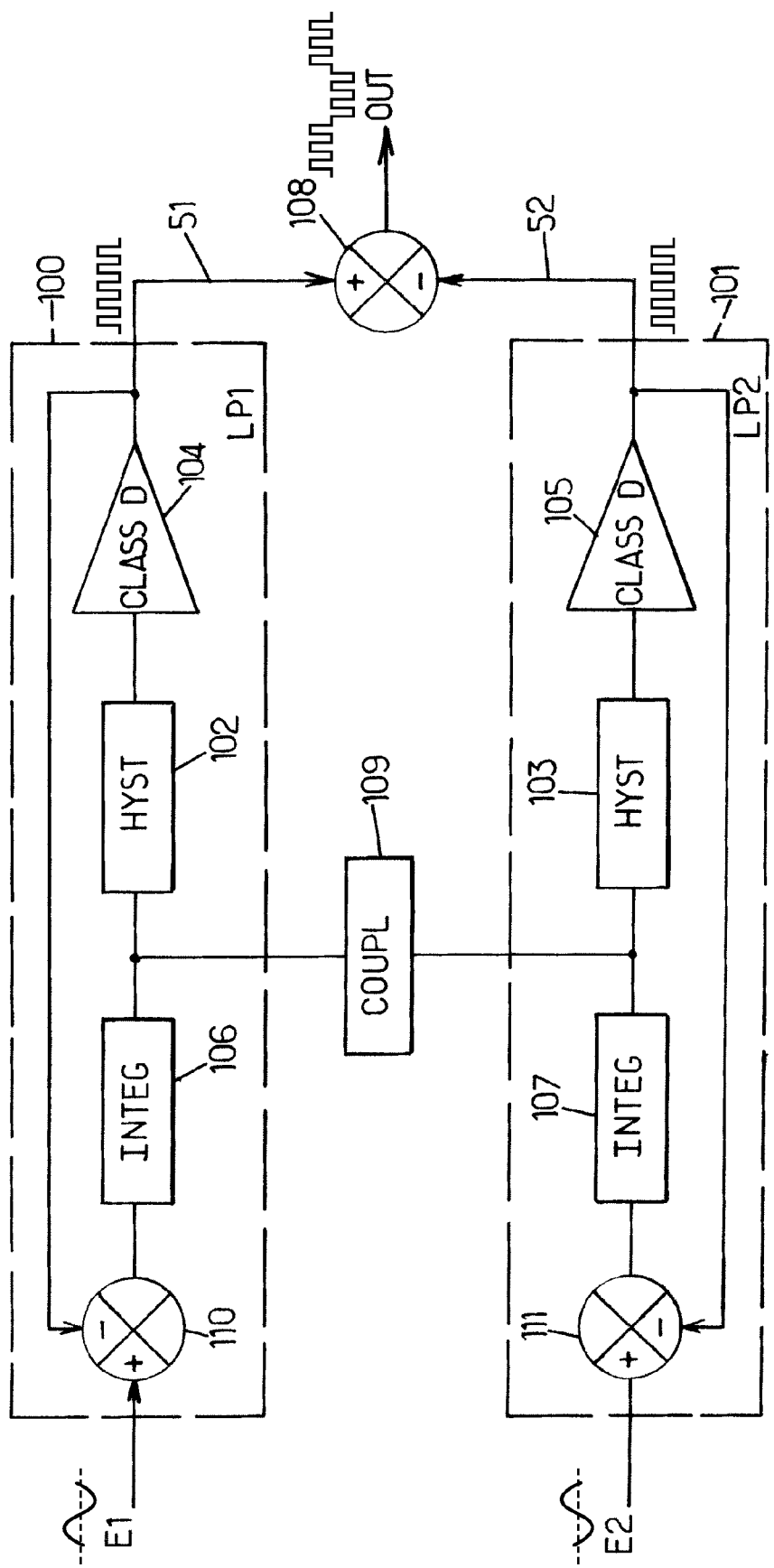
FIG. 1 is a schematic illustration of a circuit according to embodiments of the present invention.

FIG. 1 shows a self oscillating modulator circuit according to an embodiment. The circuit of FIG. 1 comprises two class D self oscillating loop modules 100, 101. Each module comprises:

- an hysteresis comparator 102, 103,
- a class D amplifier 104, 105,
- an integrator module 106, 107, and
- a comparator 110, 111 comparing an input signal E1, E2, with the output of the module, which also corresponds to the output of the class D amplifier.

The output of the comparator is fed to the integrator module, the output of the integrator module is fed to the hysteresis comparator, and the output of the hysteresis comparator is fed to the class D amplifier.

The structure of each self oscillating loop module, as it will be apparent to the person with ordinary skill in the art, enables to obtain from respective sinusoidal signals E1, E2, respective two-level output signals S1, S2. For example, E1 and E2 are in opposite phase.

The circuit of FIG. 1 further comprises summing means 108 for outputting a three level signal based on the two-level signals outputted by the self oscillating loop modules 100 and 101. The summing means 108 may affect coefficients to the output signals of the self oscillating loop modules. In the example of FIG. 1, the output signal of the self oscillating loop module 101 is affected with a coefficient "−1".

In theory, if the parameters of each component of the self oscillating loop modules are chosen to be the same, the frequencies of each signal S1, S2 are the same. However, in practice, there is a mismatch between the modules and the frequencies are not the same.

In order to synchronize the modules 10, 101, there is provided coupling means connecting said at least two self oscillating loop modules.

Figure 2:
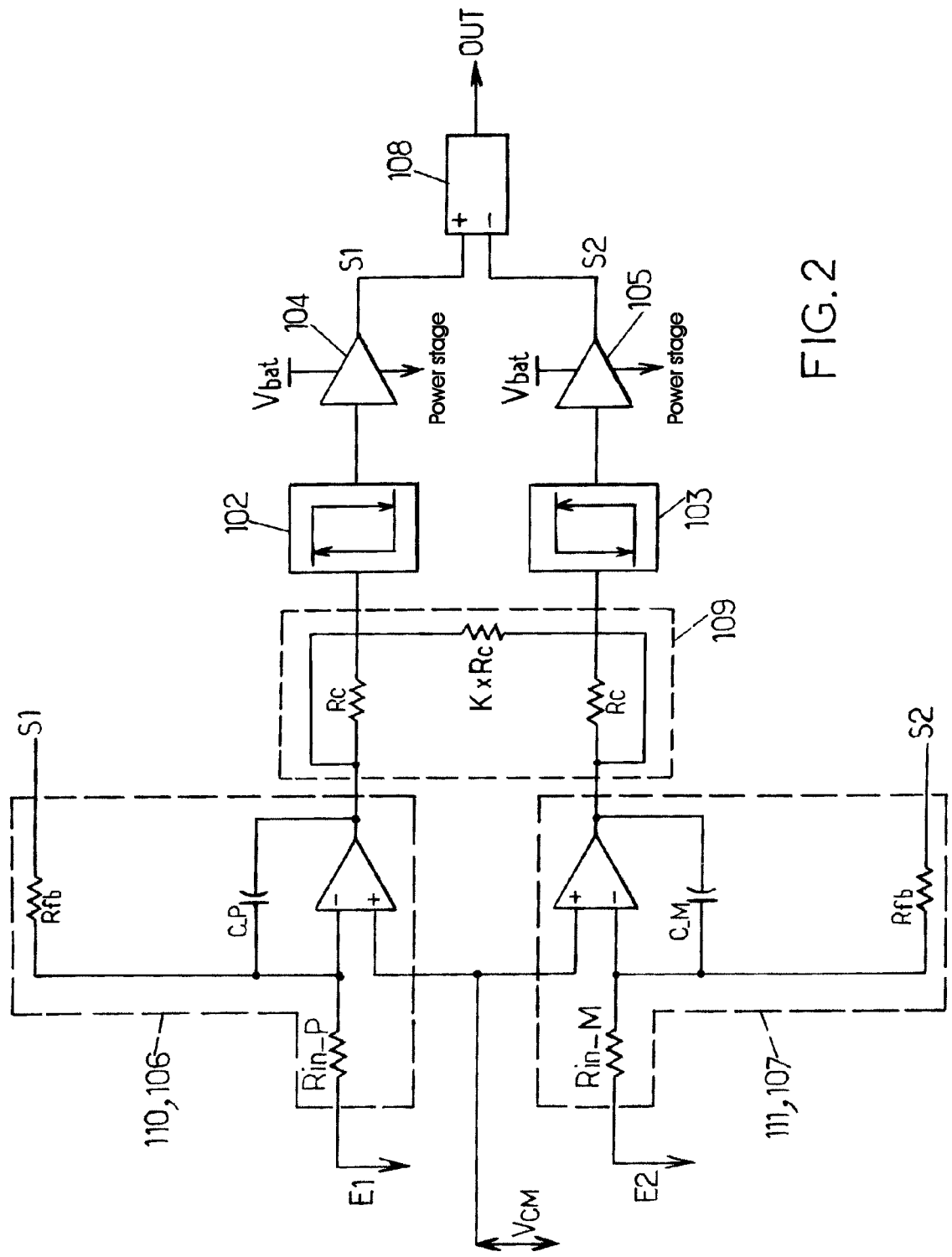
FIG. 2 is a schematic illustration of an implementation of the circuit of FIG. 1.

FIG. 2 shows an implementation of the circuit of FIG. 1. The comparators and the integrator modules are implemented using structures with operational amplifiers. The hysteresis comparators and the class D amplifiers may be implemented using structures known to the person with ordinary skill in the art.

The coupling means are implemented using a voltage divider comprising several resistors. The choice of the value of the resistors enables to couple the self oscillating loop modules more or less (for example between 0.1 and 0.05). The person with ordinary skill in the art may select the values of the resistors depending on the coupling she/he wishes to reach. The more the self oscillating loop modules are coupled the better is the efficiency of the overall circuit. However, the more the self oscillating loop modules are coupled the more the outputs of the modules are non-linear. There is a compromise to find that will be reached by the person with ordinary skill in the art depending on the hardware implementation of the circuit.

Figure 3:
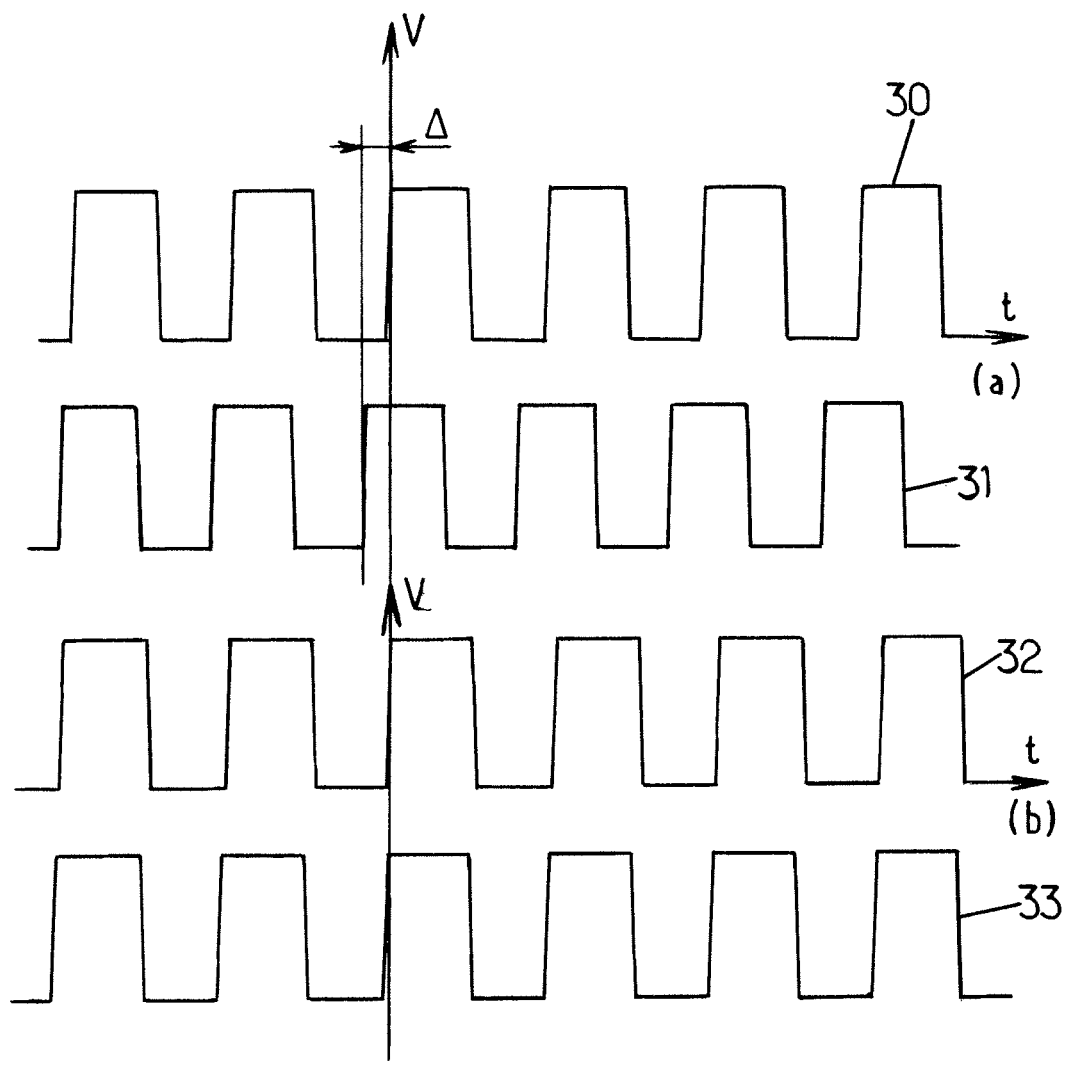
FIG. 3 illustrates the synchronization of the self oscillating loop modules.

FIG. 3 shows two graphs (a) and (b) representing the evolution of the outputs signals S1, S2 of the self oscillating loop modules, when input signals E1 and E2 are set to zero.

Graph (a) shows a curve 30 representing output signal S1, and a curve 31 representing output signal S2 when the coupling means 109 are not activated. In this case, there is a delay D between the two signals S1 and S2

Graph (b) shows a curve 32 representing output signal S1, and a curve 33 representing output signal S2 when the coupling means are activated. In this case there is no delay between the two signals and thus the self oscillating loop modules are synchronized.

Figure 4:
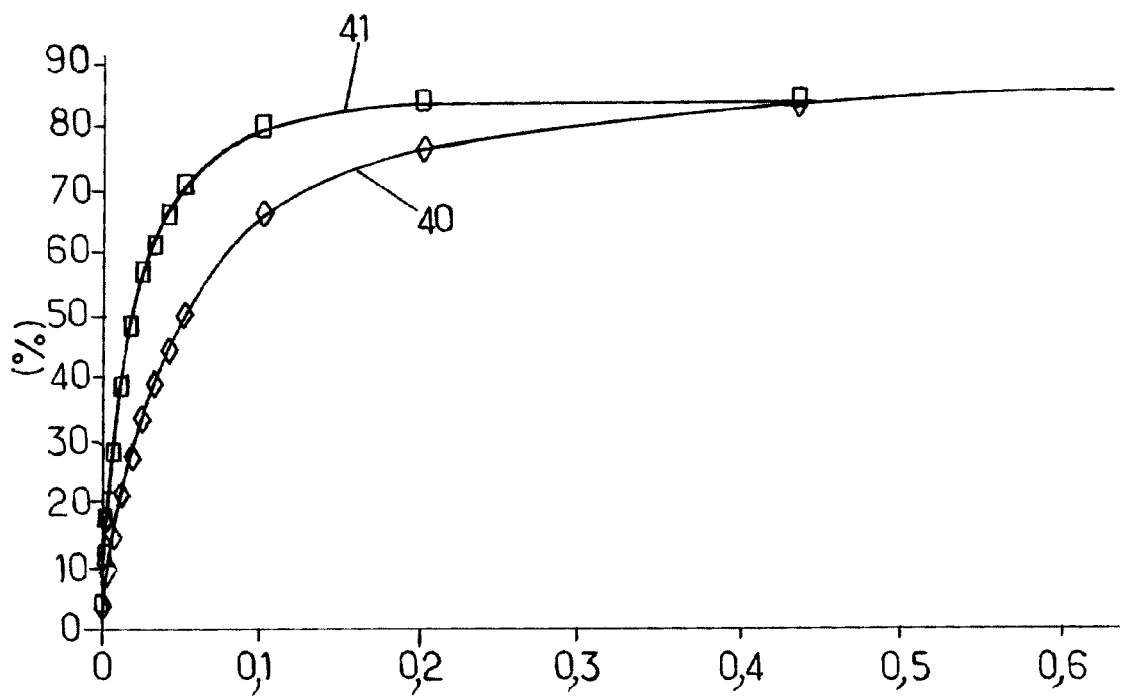
FIG. 4 is a graph comparing the efficiency of a circuit according to an embodiment with a circuit of the prior art.

FIG. 4 shows a graph that illustrates the efficiency of a circuit according to the present invention and a circuit of the prior art. The graph shows the evolution of the efficiency of the circuits (efficiency being defined as the ratio between the power available at the output of the circuit and the amount of power consumed by the circuit) with the power delivered by the circuits (in watts). Curve 40 represents the efficiency of a circuit according to the prior art, and curve 41 represents the efficiency of a circuit according to an embodiment of the invention.

The circuit according to the present invention has a better efficiency than the circuit according to the prior art, particularly for the low power outputs. This is particularly noticeable since the amplifiers wherein the circuit according to the invention may be installed are generally used at low powers (for example most of the time MP3 players are used at relatively low levels).

Figure 5:
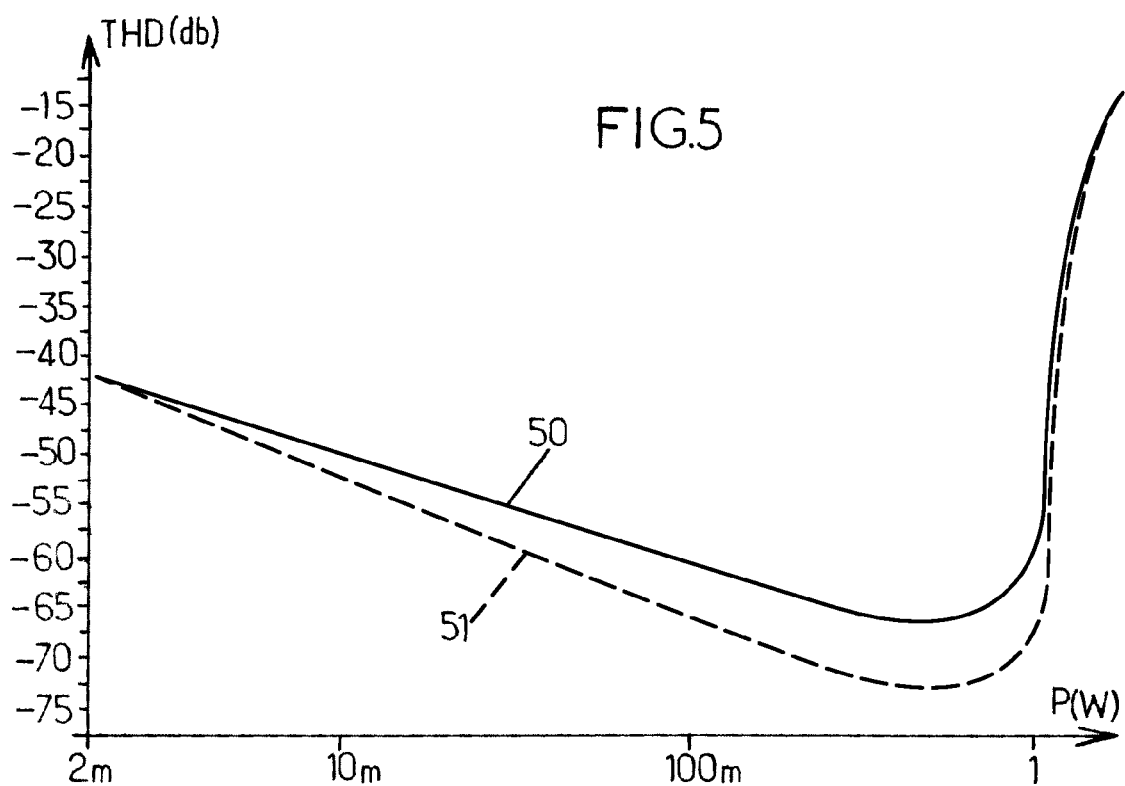
FIG. 5 is a graph comparing the evolution of the THD+N of a circuit according to an embodiment with a circuit of the prior art.

FIG. 5 shows the evolution with the output power of the total harmonic distortion plus noise (THD+N in dB) of the output signal of a circuit according to the present invention (curve 50), and that of the output of a circuit of the prior art (curve 51).

The circuit according to the present invention has a better THD+N than the circuit according to the prior art except in the saturation zone on the right and for very low powers on the left.

Thus, the circuit according to the present invention achieves a good efficiency with a low noise.

The present invention can be embedded in an audio amplifier of an audio device. The device may be a mobile device such as an MP3 player.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

A person skilled in the art will readily appreciate that various parameters disclosed in the description may be modified and that various embodiments disclosed may be combined without departing from the scope of the invention.

The invention claimed is:

1. A self-oscillating modulator circuit comprising:
   at least two class D self-oscillating loop modules, each module comprising an hysteresis comparator, and each module being configured for receiving a respective input signal and outputting a respective two-level signal;
   coupling means connecting said at least two class D self-oscillating loop modules, ahead of the hysteresis comparator of each module, for synchronizing said at least two class D self-oscillating loop modules; and
   summing means for summing the respective output signals of each of said at least two class D self-oscillating loop modules and for outputting a multi-level modulated output signal.

2. The circuit according to claim 1, wherein each of the at least two class D self-oscillating loop modules comprise:
   an integrator module, the output of which is connected to the hysteresis comparator;
   a class D amplifier, the input of which is connected to the output of the hysteresis comparator; and
   a comparator for comparing the input signal of the class D self-oscillating loop module with the output of the class D amplifier, the output of the comparator being connected to the input of the integrator module.

3. The circuit according to claim 1, wherein the coupling means comprises:
   a voltage divider connected between the respective inputs of the hysteresis comparators of the class D self-oscillating loop modules, for coupling said modules.

4. The circuit according to claim 1,
   wherein said at least two class D self-oscillating loop modules are configured for receiving respective input signals being in phase opposition.

5. An audio amplifier comprising a circuit according to claim 1.

6. An audio device comprising the audio amplifier according to claim 5.

7. A method of generating a multi-level modulated output signal in a self-oscillating modulator circuit, the method comprising:
   outputting from at least two class D self-oscillating loop modules comprising an hysteresis comparator, respective two-level signals from respective input signals,
   coupling said at least two class D self-oscillating loop modules, ahead of the hysteresis comparator of each module, for synchronizing said at least two class D self-oscillating loop modules, and
   summing the respective output signals of each of said at least two class D self-oscillating loop modules; and
   outputting a multi-level modulated output signal.

8. The method according to claim 7, wherein each of the at least two class D self-oscillating loop modules comprise an integrator module, the output of which is connected to the hysteresis comparator, and a class D amplifier, the input of which is connected to the output of the hysteresis comparator, the method further comprising:
   comparing the input signal of the class D self-oscillating loop module with the output of the class D amplifier, the output of the comparator being connected to the input of the integrator module.

9. The method according to claim 7, further comprising:
   coupling said at least two class D self-oscillating loop modules by a voltage divider which is connected between the respective inputs of the hysteresis comparators of the class D self-oscillating loop modules.

10. The method according to claim 7, further comprising: receiving said respective input signals in phase opposition.

11. A self-oscillating modulator circuit comprising:
at least two class D self-oscillating loop modules, each module comprising an hysteresis comparator, and each module being configured to receive a respective input signal and to output a respective two-level signal;
a coupling element which connects said at least two class D self-oscillating loop modules, ahead of the hysteresis comparator of each module, for synchronizing said at least two class D self-oscillating loop modules, and
a summer for summing the respective output signals of each of said at least two class D self-oscillating loop modules and for outputting a multi-level modulated output signal.

12. The circuit according to claim 11, wherein each of the at least two class D self-oscillating loop modules comprise:
an integrator module, the output of which is connected to the hysteresis comparator;
a class D amplifier, the input of which is connected to the output of the hysteresis comparator; and
a comparator for comparing the input signal of the class D self-oscillating loop module with the output of the class D amplifier, the output of the comparator being connected to the input of the integrator module.

13. The circuit according to claim 11, wherein said coupling element comprises:
a voltage divider connected between the respective inputs of the hysteresis comparators of the class D self-oscillating loop modules, for coupling said modules.

14. The circuit according to claim 11,
wherein each of said at least two class D self-oscillating loop modules are configured for receiving respective input signals being in phase opposition.

* * * * *